United States Patent
Finkbeiner et al.

(10) Patent No.: US 10,304,502 B2
(45) Date of Patent: May 28, 2019

(54) ACCESSING DATA IN MEMORY

(71) Applicant: Micron Technology, Inc., Boise, ID (US)

(72) Inventors: Timothy P. Finkbeiner, Boise, ID (US); Glen E. Hush, Boise, ID (US); David L. Pinney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/194,024

(22) Filed: Nov. 16, 2018

(65) Prior Publication Data

US 2019/0088291 A1    Mar. 21, 2019

Related U.S. Application Data (63) Continuation of application No. 16/004,122, filed on Jun. 8, 2018, now Pat. No. 10,147,468, which is a
(Continued)

(51) Int. Cl.
| | | |
|---|---|---|
| G11C 7/02 | (2006.01) |
| G11C 7/06 | (2006.01) |
| G11C 11/4096 | (2006.01) |
| G11C 11/4094 | (2006.01) |
| G11C 11/4091 | (2006.01) |

(Continued)

(52) U.S. Cl.
CPC .......... G11C 7/065 (2013.01); G11C 7/1006 (2013.01); G11C 7/106 (2013.01); G11C 7/1012 (2013.01); G11C 7/1087 (2013.01); G11C 7/22 (2013.01); G11C 11/4076 (2013.01); G11C 11/4091 (2013.01); G11C 11/4094 (2013.01);
(Continued)

(58) Field of Classification Search
CPC .. G11C 11/5642; G11C 13/0069; G11C 16/26
See application file for complete search history.

(56) References Cited

U.S. PATENT DOCUMENTS

| | | |
|---|---|---|
| 4,380,046 A | 4/1983 | Fung |
| 4,435,792 A | 3/1984 | Bechtolsheim |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
(Continued)

*Primary Examiner* — Tuan T Nguyen
(74) *Attorney, Agent, or Firm* — Brooks, Cameron & Huebsch, PLLC (57) ABSTRACT

The present disclosure includes apparatuses and methods related to accessing data in memory. One example method comprises storing data associated with a first operation in a first sense amplifier responsive to receiving a request to perform a second operation, and performing the second operation associated with a row of memory cells while the data associated with the first operation is being stored in the first sense amplifier.

20 Claims, 6 Drawing Sheets

Related U.S. Application Data continuation of application No. 15/494,879, filed on Apr. 24, 2017, now Pat. No. 9,997,212.

(51) Int. Cl.
*G11C 11/4076* (2006.01)
*G11C 7/10* (2006.01)
*G11C 7/22* (2006.01)

(52) U.S. Cl.
CPC .... *G11C 11/4096* (2013.01); *G11C 2207/229* (2013.01); *G11C 2211/4013* (2013.01)

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,436,733 B2 * | 10/2008 | Mokhlesi ............... G11C 7/02 365/185.18 |
| 7,447,720 B2 | 11/2008 | Beaumont |
| 7,454,451 B2 | 11/2008 | Beaumont |
| 7,457,181 B2 | 11/2008 | Lee et al. |
| 7,463,501 B2 * | 12/2008 | Dosaka ................. G11C 15/00 365/49.1 |
| 7,518,923 B2 * | 4/2009 | Mokhlesi ........... G11C 11/5642 365/185.03 |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,684,237 B2 * | 3/2010 | Moschiano ........ G11C 16/3418 365/185.02 |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shinano et al. |
| 8,279,683 B2 | 10/2012 | Klein |
| 8,310,884 B2 | 11/2012 | Iwai et al. |

(56) References Cited

U.S. PATENT DOCUMENTS

| | | |
|---|---|---|
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,767,450 B2 * | 7/2014 | Kim .............. G11C 13/0004 365/163 |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,659,605 B1 | 5/2017 | Zawodny et al. |
| 9,659,610 B1 | 5/2017 | Hush |
| 9,697,876 B1 | 7/2017 | Tiwari et al. |
| 9,761,300 B1 | 9/2017 | Vvilicock |
| 9,997,212 B1 | 6/2018 | Finkbeiner et al. |
| 10,068,664 B1 | 9/2018 | Penney et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0228165 A1 | 11/2004 | Kim et al. |
| 2004/0233758 A1 | 11/2004 | Kim et al. |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2005/0146974 A1 | 7/2005 | Halbert |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0110817 A1 | 5/2010 | Noda |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |

(56) References Cited

U.S. PATENT DOCUMENTS

| | | |
|---|---|---|
| 2015/0357047 A1 | 12/2015 | Tiwari |
| 2016/0049192 A1 | 2/2016 | Lee |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |
| 2016/0365129 A1 | 12/2016 | Willcock |
| 2016/0371033 A1 | 12/2016 | La Fratta et al. |
| 2017/0052906 A1 | 2/2017 | Lea |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1999 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

International Search Report and Written Opinion for related PCT Application No. PCT/US2018/028810, dated Aug. 9, 2018, 10 pages.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algoritms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory As a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs. ).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

\* cited by examiner

Table 6-1:

| A (644) | B (645) | NOT OPEN | OPEN TRUE | OPEN INVERT |
|---|---|---|---|---|
| 0 | 0 | 0 | 0 | 1 |
| 0 | 1 | 0 | 1 | 0 |
| 1 | 0 | 1 | 0 | 1 |
| 1 | 1 | 1 | 1 | 0 |

675 ⟶ ✕✕

Table 6-2 (680):

| | | | | | | | | | | |
|---|---|---|---|---|---|---|---|---|---|---|
| FF | 0 | 0 | 0 | 0 | 0 | 0 | 1 | 1 | 1 | ← 676 |
| FT | 0 | 0 | 0 | 1 | 1 | 1 | 0 | 0 | 0 | ← 677 |
| TF | 0 | 0 | 1 | 0 | 0 | 1 | 0 | 0 | 1 | ← 678 |
| TT | 0 | 1 | 0 | 0 | 1 | 0 | 0 | 1 | 0 | ← 679 |
| A | B | A | $A*B$ | $A*\bar{B}$ | $A+B$ | B | $A \times B$ | $A+\bar{B}$ | $\overline{A \times B}$ | $\bar{B}$ |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 1 | 0 | 1 | 1 | 0 | 1 |
| 1 | 1 | 1 | 1 | 0 | 1 | 1 | 0 | 1 | 1 | 0 |

(header row ← 647)

*Fig. 6*

ACCESSING DATA IN MEMORY

PRIORITY INFORMATION

This application is a Continuation of U.S. application Ser. No. 16/004,122 filed Jun. 8, 2018, which issues as U.S. Pat. No. 10,147,468 on Dec. 4, 2018, which is a Continuation of U.S. application Ser. No. 15/494,879 filed Apr. 24, 2017, which issued as U.S. Pat. No. 9,997,212 on Jun. 12, 2018, the contents of which are included herein by reference.

TECHNICAL FIELD

The present disclosure relates generally to semiconductor memory and methods, and more particularly, to apparatuses and methods related to accessing data in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAIVI), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation (e.g., a compute operation) on data (e.g., one or more operands). As used herein, a compute operation can be, for example, a Boolean operation, such as AND, OR, NOT, NOT, NAND, NOR, and XOR, and/or other operations (e.g., invert, shift, arithmetic, statistics, among many other possible operations) that may involve manipulating data. For example, functional unit circuitry may be used to perform the arithmetic operations, such as addition, subtraction, multiplication, and division on operands, via a number of logical operations. A compute operation such as described above can be distinguished from a "memory operation," which, as used herein, can refer to an operation that does not involve data manipulation (e.g., via a functional unit often associated with a processing resource). Examples of memory operations include data read, data write, and data refresh operations.

In many instances, the processing resources (e.g., processor and associated functional unit circuitry) may be external to the memory array, and data is accessed via a bus between the processing resources and the memory array to execute a set of instructions. Processing performance may be improved in a processing-in-memory (PIM) device, in which a processing and/or logic resource may be implemented internally and/or near to a memory (e.g., directly on a same chip as the memory array). A processing-in-memory (PIM) device may save time by reducing and eliminating external communications and may also conserve power.

DETAILED DESCRIPTION

The present disclosure includes apparatuses and methods related to accessing data in memory. One example method comprises storing data associated with a first operation in a first sense amplifier responsive to receiving a request to perform a second operation, and performing the second operation associated with a memory cell while the data associated with the first operation is being stored in the first sense amplifier.

Embodiments of the present disclosure can include sensing circuitry having various benefits as compared to previous approaches. For example, as compared to previous approaches, the sensing circuitry of a number of embodiments can enable the sensing circuitry to, while performing a first operation, initiate performing a second operation without completing the first operation. As such, the second operation can be initiated without, for instance, experiencing a latency associated with completing the first operation. Therefore, when the second operation has a priority over the first operation, a number of embodiments of the present disclosure can provide benefits, among others, such as a reduced latency in initiating the second operation.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", particularly with respect to reference numerals in the drawings, indicate that a number of the particular feature so designated can be included. As used herein, "a number of" a particular thing refers to one or more of such things (e.g., a number of memory arrays can refer to one or more memory arrays). A "plurality of" a particular thing is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 150 may reference element "50" in FIG. 1, and a similar element may be referenced as 250 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

Figure 1:
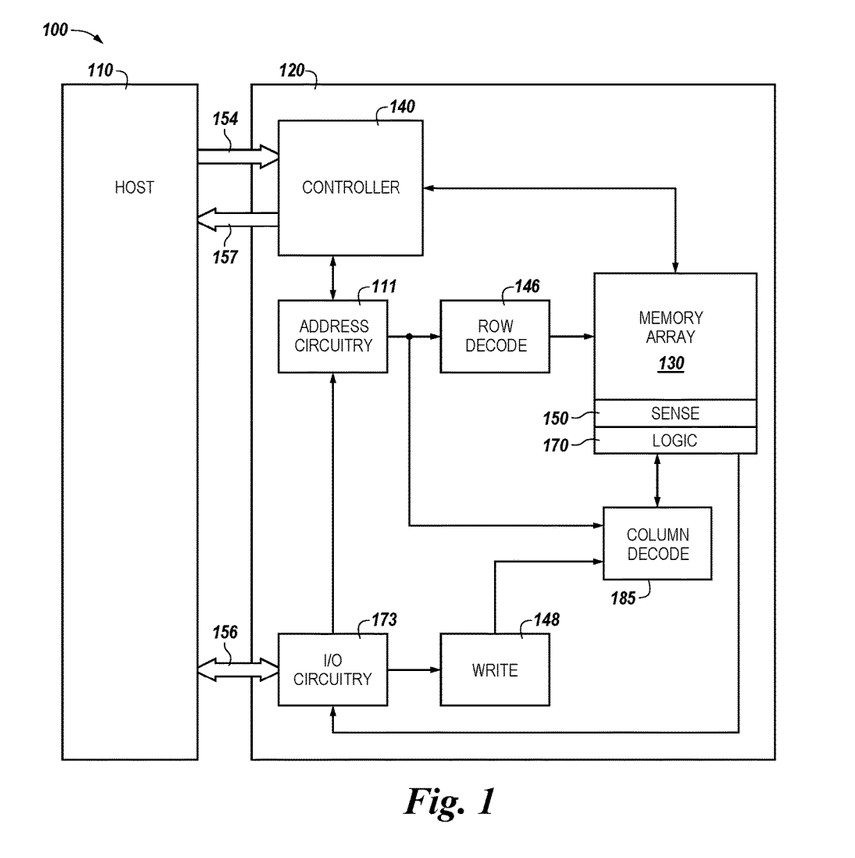
FIG. 1 is a block diagram of an apparatus in the form of a computing system including a memory device in accordance with a number of embodiments of the present disclosure.

FIG. 1 is a block diagram of an apparatus in the form of a computing system 100 including a memory device 120 in accordance with a number of embodiments of the present disclosure. As used herein, a memory device 120, controller 140, memory array 130, sensing circuitry 150, and/or logic circuitry 170 might also be separately considered an "apparatus."

System 100 includes a host 110 coupled to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, etc.).

The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines, which may be referred to herein as word lines and/or select lines, and columns coupled by sense lines, which may be referred to herein as data lines and/or digit lines. Although a single array 130 is shown in FIG. 1, embodiments are not so limited. For instance, memory device 120 may include a number of arrays 130 (e.g., a number of banks of DRAM cells, NAND flash cells, etc.). Additionally, although not shown, a plurality of memory devices 120 can be coupled to host 110 via a respective plurality of memory channels.

The memory device 120 includes address circuitry 111 to latch address signals provided over a bus 156 through I/O circuitry 173. Bus 156 can serve as a data bus (e.g., an I/O bus) and as an address bus; however, embodiments are not so limited. Address signals can be received through address circuitry 111 and decoded by a row decoder 184 and a column decoder 185 to access the memory array 130. Status information, which can include exception information, can be provided from the controller 140 on the memory device 120 to host 110 through a status channel that includes a high speed interface (HSI), which can include an out-of-band bus 157. An out-of-band bus can refer to a bus separate from a data (e.g., DQ) bus. Data can be read from memory array 130 by sensing voltage and/or current changes on the data lines using sensing circuitry 150. The sensing circuitry 150 can read and latch a page (e.g., row) of data from the memory array 130. The I/O circuitry 173 can be used for bi-directional data communication with host 110 over the bus 156. The write circuitry 135 can be used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130, among other functions. For example, executing instructions from host 110 can include performing compute operations using processing resources corresponding to the sensing circuitry 150 and/or logic 170, as described further herein. The controller 140 can include a state machine (e.g., firmware and/or hardware in the form of an application specific integrated circuit (ASIC)), a sequencer, a control logic, and/or some other type of controlling circuitry. In the example shown in FIG. 1A, the controller 140 includes a register 134 (e.g., a status register), which may store status information in accordance with a number of embodiments described herein. A more detailed diagram of one example of controller 140 is described in association with FIG. 1B.

As described further below, in a number of embodiments, the sensing circuitry 150 can comprise a number of sense amplifiers and a number of compute components, which may serve as, and be referred to herein as an accumulator, and can be used to perform various compute operations (e.g., to perform logical operations on data associated with complementary sense lines). In a number of embodiments, storage locations (e.g., latches) corresponding to the compute components can serve as stages of a shift register. For example, clock signals can be applied to the compute components to shift data from one compute component to an adjacent compute component.

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various compute operations can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute operations using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150.

In a number of embodiments, the sensing circuitry 150 can be formed on pitch with the memory cells of the array. For example, the cells of memory array may have a particular cell size (e.g., $4F^2$ or $6F^2$, where "F" is a feature size corresponding to the cells). As described further below, in a number of embodiments, sensing components (e.g., respective sense amplifier and compute component pairs) corresponding to sensing circuitry 150 are formed on a same pitch as sense lines of the array and can be operated to perform various compute operations. For instance, if the sense line pitch is 3F, the transistors of the sensing components can fit within the same 3F pitch. In contrast, the devices (e.g., logic gates) associated with ALU circuitry of various previous processor-in-memory (PIM) systems may not be capable of being formed on pitch with the memory cells, which can increase chip size as compared to a number of embodiments of the present disclosure, for example. Additional logic circuitry 170 can be coupled to and/or additional sense amplifier (e.g., a first sense amplifier 206-1 and a second sense amplifier 206-2 implemented in the sensing circuitry 250 as illustrated in FIG. 2) can be implemented within the sensing circuitry 150 and can be used to store (e.g., cache and/or buffer) results of operations described herein.

As such, in a number of embodiments, circuitry external to array 130 and sensing circuitry 150 is not needed to perform compute operations as the sensing circuitry 150 can be operated to perform various compute operations (e.g., logical operations associated with mathematical operations) without the use of an external processing resource. In a number of embodiments, the sensing circuitry 150 can be operated as a number of 1-bit processing resources, with the sensing components coupled to respective columns of the array 130 serving as respective 1-bit processing elements. Therefore, the sensing circuitry 150 may be used to complement and/or to replace, at least to some extent, an external processing resource such as ALU circuitry of a host.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., 150) without enabling column decode lines of the array. Whether or not local I/O lines are used in association with performing logical operations via sensing circuitry 150, the local I/O line(s) may be enabled in order to transfer a result to a suitable location other than back to the array 130.

Figure 2:
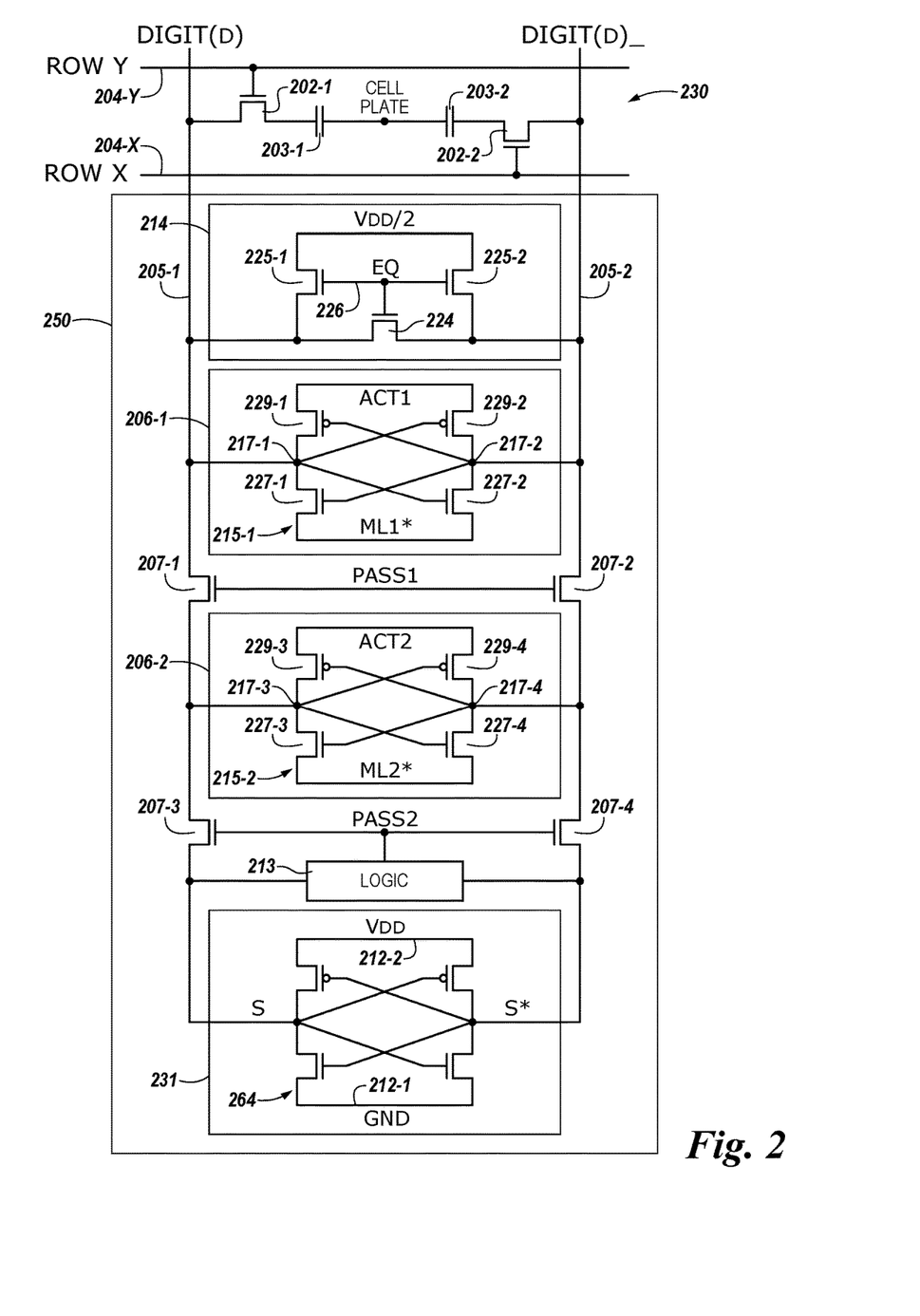
FIG. 2 is a schematic diagram illustrating sensing circuitry in accordance with a number of embodiments of the present disclosure.

FIG. 2 is a schematic diagram illustrating sensing circuitry 250 in accordance with a number of embodiments of the present disclosure. The sensing circuitry 250 can correspond to sensing circuitry 150 shown in FIG. 1. In the example shown in FIG. 2, a memory cell includes a storage element (e.g., capacitor) and an access device (e.g., transistor). For instance, a first memory cell includes transistor 202-1 and capacitor 203-1, and a second memory cell can include transistor 202-2 and capacitor 203-2, etc. In this embodiment, the memory array 230 is a DRAM array of 1T1C (one transistor one capacitor) memory cells, although other cell configurations can be used (e.g., 2T2C with two transistors and two capacitors per memory cell).

In a number of embodiments, memory cells may be destructive read memory cells. When the memory cells coupled to the row are destructive read memory cells, enabling the row destroys the data stored in the memory cells such that the data originally stored in the memory cells is refreshed after being read. As such, enabling the row coupled to the memory cell to continue performing an operation requires the data to be refreshed prior to performing another operation. Therefore, when the another operation has a priority over the first operation being performed, experiencing latencies due to continue performing the operation is undesirable.

Figure 5:
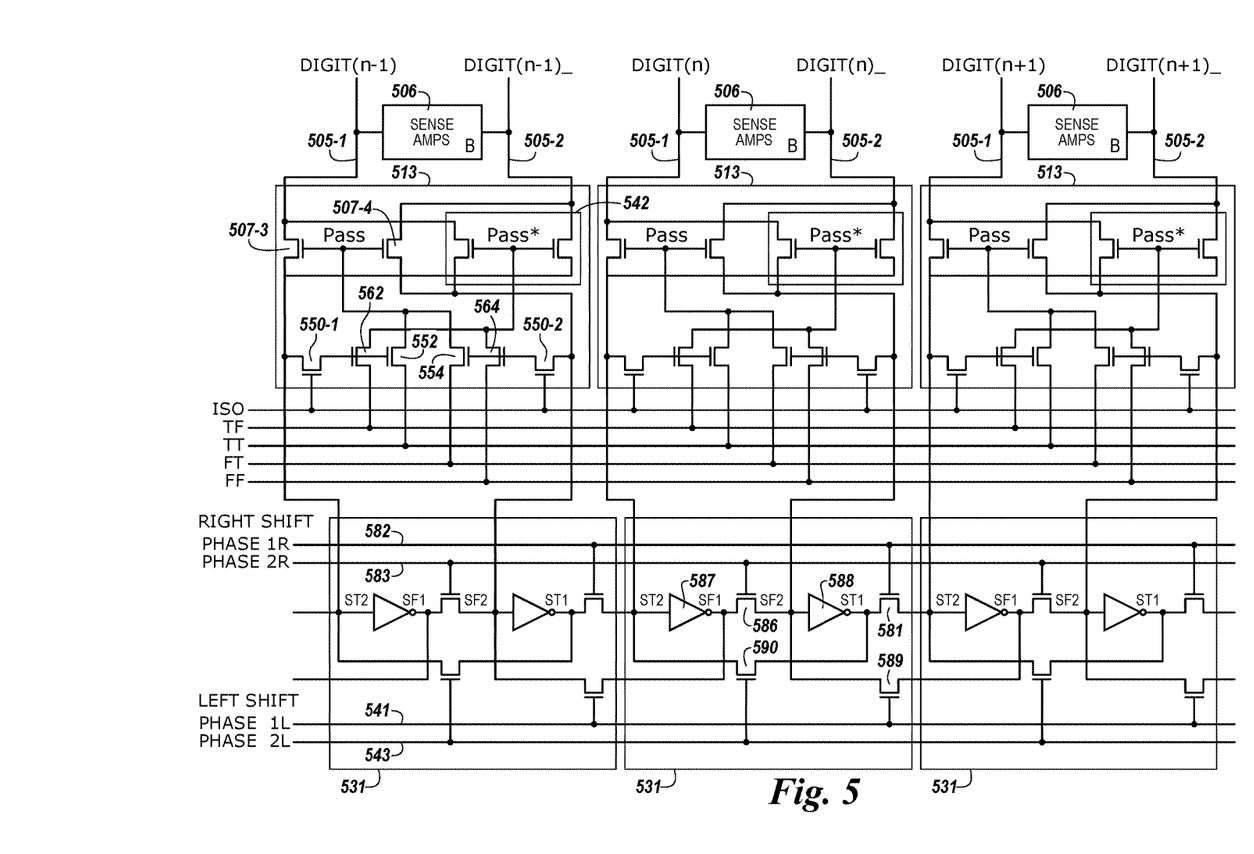
FIG. 5 is a schematic diagram illustrating sensing circuitry in accordance with a number of embodiments of the present disclosure.

The cells of the memory array 230 can be arranged in rows coupled by access (word) lines 204-X (ROW X), 204-Y (ROW Y), etc., and columns coupled by pairs of complementary sense lines (e.g., digit lines DIGIT(D) and DIGIT(D)_ shown in FIG. 2 and DIGIT_(n) and DIGIT(n)_ shown in FIG. 5). The individual sense lines corresponding to each pair of complementary sense lines can also be referred to as digit lines 205-1 for DIGIT (D) and 205-2 for DIGIT (D)_, respectively. Although only one pair of complementary digit lines are shown in FIG. 2, embodiments of the present disclosure are not so limited, and an array of memory cells can include additional columns of memory cells and digit lines (e.g., 4,096, 8,192, 16,384, etc.).

Although rows and columns are illustrated as being orthogonal to each other, embodiments are not so limited. For example, the rows and columns may be oriented relative to each other in various other two-dimensional or three-dimensional configurations.

Memory cells can be coupled to different digit lines and word lines. For example, a first source/drain region of a transistor 202-1 can be coupled to digit line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to digit line 205-2 (D)_, a second source/drain region of transistor 202-2 can be coupled to capacitor 203-2, and a gate of a transistor 202-2 can be coupled to word line 204-X. A cell plate, as shown in FIG. 2, can be coupled to each of capacitors 203-1 and 203-2. The cell plate can be a common node to which a reference voltage (e.g., ground) can be applied in various memory array configurations.

The memory array 230 is configured to couple to sensing circuitry 250 in accordance with a number of embodiments of the present disclosure. In this embodiment, the sensing circuitry 250 comprises sense amplifier 206-1, sense amplifier 206-2, equilibration circuitry 214, and a compute component 231 corresponding to respective columns of memory cells (e.g., coupled to respective pairs of complementary digit lines). Sense amplifier 206-1 and Sense amplifier 206-2 can be coupled to the pair of complementary digit lines 205-1 and 205-2. Compute component 231 can be coupled to the sense amplifier 206-2 via pass gates 207-3 and 207-4. The gates of the pass gates 207-3 and 207-4 can be coupled to operation selection logic 213.

The sensing circuitry 250 can include equilibration circuitry 214, which can be configured to equilibrate the digit lines 205-1 (D) and 205-2 (D)_. In this example, the equilibration circuitry 214 comprises a transistor 224 coupled between digit lines 205-1 (D) and 205-2 (D)_. The equilibration circuitry 214 also comprises transistors 225-1 and 225-2 each having a first source/drain region coupled to an equilibration voltage (e.g., $V_{DD}/2$), where VDD is a supply voltage associated with the array. A second source/drain region of transistor 225-1 can be coupled digit line 205-1 (D), and a second source/drain region of transistor 225-2 can be coupled digit line 205-2 (D)_. Gates of transistors 224, 225-1, and 225-2 can be coupled together, and to an equilibration (EQ) control signal line 226. As such, activating EQ enables the transistors 224, 225-1, and 225-2, which effectively shorts digit lines 205-1 (D) and 205-2 (D)_ together and to the equilibration voltage (e.g., $V_{DD}/2$).

Sense amplifier 206-1 and Sense amplifier 206-2 can comprise a cross coupled latch, which can be referred to herein as a primary latch. In the example illustrated in FIG. 2, sense amplifier 206-1 and sense amplifier 206-2 each comprises a latch 215-1 and 215-2, respectively, and each latch 215-1 and 215-2 includes four transistors coupled to a pair of complementary digit lines 205-1 and 205-2. However, embodiments are not limited to this example. Each latch 215-1 and 215-2 can be a cross coupled latch (e.g., gates of a pair of transistors) such as n-channel transistors (e.g., NMOS transistors) 227-1 and 227-2 of the latch 215-1 or 227-3 and 227-4 of the latch 215-2 are cross coupled with the gates of another pair of transistors, such as p-channel transistors (e.g., PMOS transistors) 229-1 and 229-2 of the latch 215-1 or 229-3 and 229-4 of the latch 215-2).

Sense amplifier 206-2 can be operated to store data associated with an operation being performed by Sense amplifier 206-1. For example, a request to initiate an operation (e.g., a memory operation) may be received while performing another operation (e.g., compute operation) using sense amplifier 206-2. In this example, sense amplifier 206-1 can be isolated from sense amplifier 206-2 via pass gates 207-1 and 207-2. The isolated sense amplifier 206-1 can then be enabled to initiate and perform the requested memory operation while the data associated with the compute operation is being stored in sense amplifier 206-2. In a number of embodiments, sense amplifier 206-2 can continue performing the compute operation via the compute component 231 while sense amplifier 206-1 performs the memory operation.

Sense amplifier 206-1 can be operated to determine a data value (e.g., logic state) stored in a selected memory cell. In operation, when a memory cell is being sensed (e.g., read), the voltage on one of the digit lines 205-1 (D) or 205-2 (D)_ will be slightly greater than the voltage on the other one of digit lines 205-1 (D) or 205-2 (D)_. An ACT signal can be driven high and an RNL2* signal can be driven low to enable (e.g., fire) the second sense amplifier 206-2. The digit lines 205-1 (D) or 205-2 (D)_ having the lower voltage will turn on one of the PMOS transistor 229-1 or 229-2 to a greater extent than the other of PMOS transistor 229-1 or 229-2, thereby driving high the digit line 205-1 (D) or 205-2 (D)_ having the higher voltage to a greater extent than the other digit line 205-1 (D) or 205-2 (D)_ is driven high.

Similarly, the digit line 205-1 (D) or 205-2 (D)_ having the higher voltage will turn on one of the NMOS transistor 227-1 or 227-2 to a greater extent than the other of the NMOS transistor 227-1 or 227-1, thereby driving low the digit line 205-1 (D) or 205-2 (D)_ having the lower voltage to a greater extent than the other digit line 205-1 (D) or 205-2 (D)_ is driven low. As a result, after a short delay, the digit line 205-1 (D) or 205-2 (D)_ having the slightly greater voltage is driven to the voltage of the supply voltage VDD through a source transistor, and the other digit line 205-1 (D) or 205-2 (D)_ is driven to the voltage of the reference voltage (e.g., ground) through a sink transistor. Therefore, the cross coupled NMOS transistors 227-1 and 227-2 and PMOS transistors 229-1 and 229-2 serve as a sense amplifier pair, which amplify the differential voltage on the digit lines 205-1 (D) and 205-2 (D)_ and operate to latch a data value sensed from the selected memory cell.

Embodiments are not limited to the sense amplifier 206-1 and the sense amplifier 206-2 configuration illustrated in FIG. 2. As an example, the sense amplifier 206-1 and the sense amplifier 206-2 can be a current-mode sense amplifier and a single-ended sense amplifier (e.g., sense amplifier coupled to one digit line). Also, embodiments of the present disclosure are not limited to a folded digit line architecture such as that shown in FIG. 2.

Sense amplifier 206-2 can, in conjunction with the compute component 231, be operated to perform various operations using data from an array as input. In a number of embodiments, the result of an operation can be stored back to the array without transferring the data via a digit line address access (e.g., without firing a column decode signal such that data is transferred to circuitry external from the array and sensing circuitry via local I/O lines). As such, a number of embodiments of the present disclosure can enable performing operations using less power than various previous approaches. Additionally, since a number of embodiments eliminate the need to transfer data across local and global I/O lines and/or external data buses in order to perform compute operations (e.g., between memory and discrete processor), a number of embodiments can enable an increased (e.g., faster) processing capability as compared to previous approaches.

In a number of embodiments, the sensing circuitry 250 (e.g., sense amplifier 206-1, sense amplifier 206-2, and compute component 231) can be operated to perform a selected operation and initially store the result in one of the sense amplifier 206-1, sense amplifier 206-2, or compute component 231 without transferring data from the sensing circuitry via a local or global I/O line (e.g., without performing a sense line address access via activation of a column decode signal, for instance).

The operation selection logic 213 can be configured to include pass gate logic for controlling pass gates that couple the pair of complementary digit lines un-transposed between the sense amplifier 206-2 and the compute component 231 and swap gate logic for controlling swap gates that couple the pair of complementary digit lines transposed between the sense amplifier 206-2 and the compute component 231. The operation selection logic 213 can also be coupled to the pair of complementary digit lines 205-1 and 205-2. The operation selection logic 213 can be configured to control pass gates 207-3 and 207-4 based on a selected operation.

As shown in FIG. 2, the compute component 231 can also comprise a latch, which can be referred to herein as a secondary latch 264. The secondary latch 264 can be configured and operated in a manner similar to that described above with respect to the primary latch 215-2, with the exception that the pair of cross coupled p-channel transistors (e.g., PMOS transistors) included in the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component 231 is not limited to that shown in FIG. 2, and various other embodiments are feasible.

Figure 3:
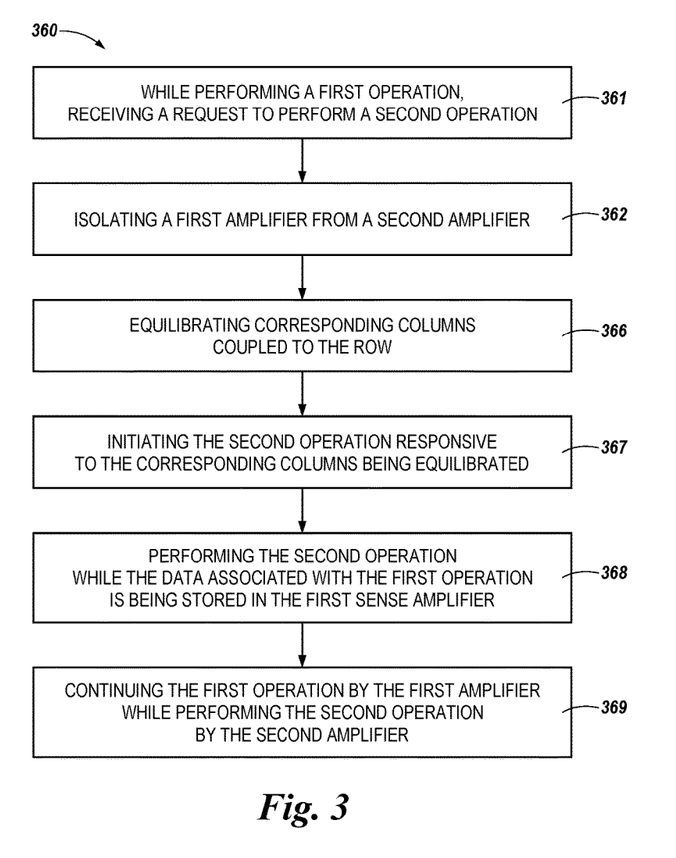
FIG. 3 illustrates a flow diagram associated with accessing data in memory in accordance with a number of embodiments of the present disclosure.

FIG. 3 is a flow diagram illustrating a method 360 associated with accessing data in memory in accordance with a number of embodiments of the present disclosure. The method 360 is associated with performing a number of operations using sensing circuitry that includes a first sense amplifier and a second sense amplifier that are analogous to the sense amplifiers 206-2 and 206-1, respectively, as illustrated in FIG. 2. At step 361, the method 360 includes, while performing a first operation, receiving a request to perform a second operation. In various embodiments, the second operation can be requested from a host (e.g., such as a host 110) such that performing the second operation involves data transfer via a high speed interface (HSI) while the first operation can be associated with a number of logic operations that employs a compute component (e.g., a compute component 231). For example, a request received from a host (e.g., a first operation) may be given a priority over an operation being performed independently from the host such that the request received from the host can be performed without completing the operation being performed independently from the host.

At step 362, the method 360 includes isolating the first amplifier from the second sense amplifier. As illustrated in association with FIG. 2, the second sense amplifier can be isolated from the first sense amplifier, for instance, via pass gates between the first sense amplifier and the second sense amplifier. In a number of embodiments, data associated with the first operation can be stored in the first sense amplifier prior to isolating the first amplifier from the second amplifier.

At step 366, the method 360 includes equilibrating corresponding columns coupled to the row, for instance, to perform the second operation. In a number of embodiments, the corresponding columns can be equilibrated without experiencing undesired latencies. For example, data associated with the first operation need not be stored back in an array of memory cells prior to initiating the second operation. At step 367, the method 360 includes initiating the second operation responsive to the corresponding columns being enabled. At step 368, the method 360 includes performing the second operation while the data associated with the first operation is being stored in the first sense amplifier. At step 369, the method 360 includes continuing the first operation by the first amplifier while performing the second operation by the second amplifier. For example, the first amplifier, which is isolated from the second amplifier, can continue performing the first operation independently from the second amplifier while the second amplifier performs the second operation. As such, two operations (e.g., first and second operations) can be performed simultaneously by a respective sense amplifier without waiting for one of the operations to complete. In a number of embodiments, the method 360 can also include storing the data associated with the first operation back to the array of memory cells responsive to completing the first operation.

Figure 4A:
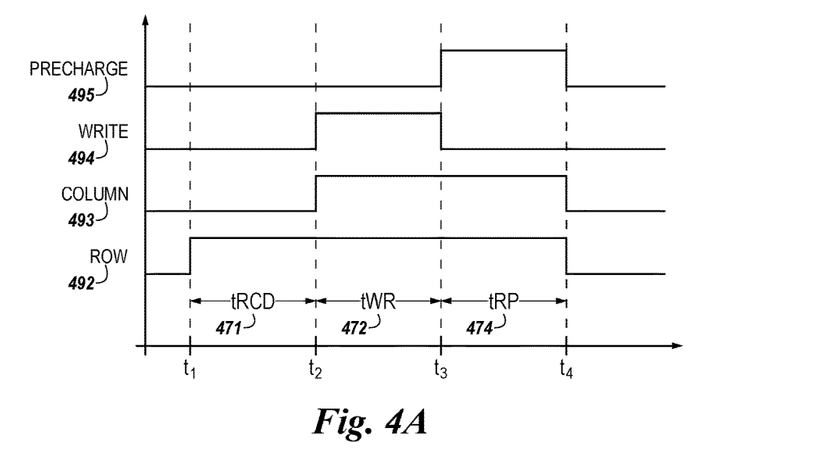
FIG. 4A illustrates a timing diagram associated with performing a number of operations using sensing circuitry.

FIG. 4A illustrates a timing diagram associated with performing a number of operations using sensing circuitry. Although memory cells described in association with FIG. 4A are not limited to a particular type of memory cells, the memory cells in FIG. 4A can be destructive memory cells as illustrated in association with FIG. 2. A first time interval 471 (e.g., from a time $t_1$ to a time $t_2$) represents a Row Address Strobe (RAS) to Column Address Strobe (CAS) delay (e.g., tRCD). As an example, at the time $t_1$, a controller (e.g., a controller 140) receives a request to perform an operation (e.g., requested from a host) while performing another operation. To complete the another operation (e.g., storing a result associated with the another operation back in an array) prior to initiating the requested operation, the controller is configured to control sensing circuitry (e.g., sensing circuitry 250) to send a row address strobe (RAS) signal to enable a row of memory cells. For example, a row 492 is enabled at the time $t_1$ (e.g., a waveform 492 is "on" at the time $t_1$) as illustrated in FIG. 4.

Subsequent to enabling the row of memory cells, the controller is further configured to control sensing circuitry to send a column address strobe (CAS) signal to enable corresponding columns (e.g., columns coupled to the row). For example, corresponding columns 493 are enabled at the time $t_2$ (e.g., a waveform 493 is "on" at the time $t_2$) as illustrated in FIG. 4. As such, the first time interval 471 represents a time (e.g., a number of clock cycles), during which the row and columns coupled to a corresponding memory cell are sequentially enabled to complete the another operation. Practically, tRCD 471 can be 15 ns, although the time interval 471 may vary depending on various types of memory devices.

A second time interval 472 (e.g., from a time $t_2$ to a time $t_3$) can represent a write recovery time (e.g., tWR). As an example, at time $t_2$, the controller initiates executing the command associated with completing the another operation. For example, the corresponding command can be a write command 494 ("e.g., a waveform 494 is "on" from the time $t_2$ to a time $t_3$). The write command can be performed to store data associated with the requested operation to memory cells coupled to the row and/or to refresh data previously stored in destructive memory cells of the row enabled at time the $t_2$ such that the data destroyed from enabling the row are refreshed in the memory cells. As such, the second time interval 472 represents a time (e.g., a number of clock cycles), during which the command associated with the another operation is executed. Practically, tWR 472 can be 15 ns, although the time interval 472 may vary depending on various types of memory devices.

A third time interval 474 (e.g., from a time $t_3$ to a time $t_4$) can represent a precharge time (e.g., tRP), in which corresponding columns are equilibrated. As an example, at time $t_3$, the controller initiates executing a precharge command (e.g., a waveform 495 is "on" from the time $t_3$ to a time $t_4$), and the corresponding columns, which were enabled while performing (e.g., completing) the another operation, are equilibrated at $t_4$. As such, the third time interval 474 represents a time (e.g., a number of clock cycles), during which the corresponding columns are equilibrated. Practically, tRP 474 can be 15 ns. As such, the memory device waits 45 ns (e.g., tRCD 471+tWR 472+tRP 474) prior to initiating the requested operation.

Figure 4B:
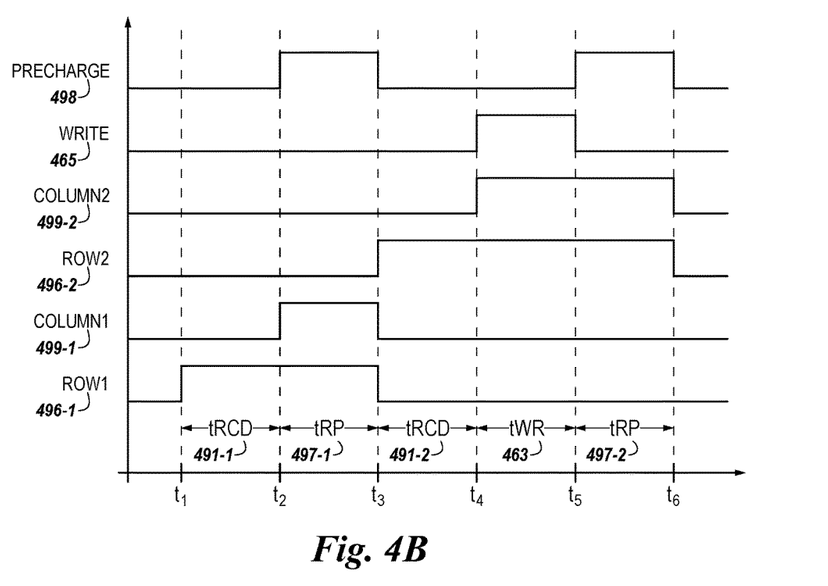
FIG. 4B illustrates a timing diagram associated with performing a number of operations using sensing circuitry in accordance with a number of embodiments of the present disclosure.

FIG. 4B illustrates a timing diagram associated with performing a number of operations using sensing circuitry in accordance with a number of embodiments of the present disclosure. In a number of embodiment of the present disclosure, the sensing circuitry can include a first sense amplifier and a second sense amplifier. As illustrated in FIG. 4A, memory cells described in association with FIG. 4B can be destructive memory cells.

In this example, a request to perform an operation (e.g., requested from a host) may be received from a time $t_1$ to a time $t_2$, for instance, while performing another operation (e.g., while enabling the row and corresponding columns associated with the another operation at the time $t_1$). For example, during a first time interval 491, a row associated with the another operation can be enabled at $t_1$ (e.g., a waveform 496-1 is "on" at the time $t_1$), and corresponding columns (e.g., columns coupled to the row) can be enabled at $t_2$ (e.g., a waveform 499-1 is "on" at the time $t_2$). Responsive to receiving the request that is given a higher priority over the another operation, the first sense amplifier may also be enabled during the first time interval 491-1 as well, and data associated with the another operation can be stored in the first sense amplifier. As such, a first time interval 491 represents a time during which the row and corresponding columns are sequentially enabled to perform the another operation, and the first sense amplifier is enabled.

In order to reduce a latency in executing the requested operation, a precharge command may be executed subsequent to the first time interval without storing (e.g., writing) the data associated with the another operation in memory cells of the row. For example, during a second time interval 497 (e.g., tRP 497-1 from a time $t_2$ to a time $t_3$), the precharge command (e.g., a waveform 498 is "on" from the time $t_2$ to a time $t_3$) may be executed, and the corresponding columns are equilibrated at $t_3$. For example, tRP 497 can be 15 ns. As such, the memory device waits 30 ns (e.g., tRCD 491+tRP 497) prior to initiating the requested operation at $t_3$.

Upon the corresponding columns are equilibrated at $t_3$, the requested operation can be initiated. For example, a row and corresponding columns associated with the requested operation can be enabled (e.g., a waveform 496-2 is "on" from the time $t_3$ to time $t_6$, and a waveform 499-2 is "on" from the time $t_4$ to time $t_6$) during the third time interval (e.g., tRCD 491-2 from $t_3$ to $t_4$). Upon the row and the corresponding columns are enabled at $t_4$, a corresponding write command can be performed (e.g., a waveform 465 is "on" from the time $t_4$ to time $t_5$) such that the data associated with the requested operation are stored in the memory cells of the row (e.g., tWR 463 from $t_4$ to $t_5$). Upon the corresponding write command is executed during the fourth time interval (e.g., tWR 463), a precharge command (e.g., a waveform 498 is "on" from the time $t_5$ to a time $t_6$) can be executed during the fifth interval 497-2 such that the corresponding columns are equilibrated at $t_6$. Although embodiments are not so limited, a row 496-1 and corresponding columns 499-1 can be same row and/or corresponding columns that are enabled by the command 496-2 and 499-2, respectively.

Unlike the sensing circuitry in FIG. 4A, the sensing circuitry in FIG. 4B, in order to initiate the requested operation, does not wait until completion of another operation. In contrast, the requested operation can be initiated without experiencing a latency associated with completing another operation. For instance, the latency, such as tWR 472 as illustrated in FIG. 4A can be avoided in a number of embodiments. As such, the sensing circuitry in FIG. 4B can include 30 ns of latency as compared to the sensing circuitry in FIG. 4A that can include 45 ns of latency prior to initiating the requested operation.

FIG. 5 is a schematic diagram illustrating sensing circuitry in accordance with a number of embodiments of the present disclosure. FIG. 5 illustrates a number of columns of an array each comprising a pair of complementary sense lines 505-1 and 505-2 coupled to corresponding sense amplifiers 506 and a compute component 535. The compute components 535 can be coupled to the sense amplifiers 506 via pass gates 507-3 and 507-4. The sense amplifiers 506 shown in FIG. 5 can correspond to a first sense amplifier 206-1 and/or a second sense amplifier 206 shown in FIG. 2. The sensing circuitry shown in FIG. 5 can correspond to sensing circuitry 150 shown in FIG. 1, for example. The logical operation selection logic 513 shown in FIG. 5 can correspond to logical operation selection logic 213 shown in FIG. 2.

The gates of the pass gates 507-3 and 507-4 can be controlled by a logical operation selection logic signal, Pass. For example, an output of the logical operation selection logic can be coupled to the gates of the pass gates 507-3 and 507-4. The compute components 535 can latch respective data values, and can be operated as a shift register via shifting of the data values (e.g., right and/or left).

As an example, the compute components 535 can comprise respective stages (e.g., shift cells) of a shift register configured to shift data values left and/or right. For example, as illustrated in FIG. 5, each compute component 535 (e.g., stage) of the shift register comprises a pair of right-shift transistors 581 and 586, a pair of left-shift transistors 589 and 590, and a pair of inverters 587 and 588. The signals PHASE 1R, PHASE 2R, PHASE 1L, and PHASE 2L can be applied to respective control lines 582, 583, 541 and 543 to enable/disable feedback on the latches of the corresponding compute components 535 in association with performing logical operations and/or shifting data in accordance with embodiments described herein.

The sensing circuitry shown in FIG. 5 also shows a logical operation selection logic 513 coupled to a number of logic selection control input control lines, including ISO, TF, TT, FT, and FF. Selection of a logical operation from a plurality of logical operations is determined from the condition of logic selection control signals on the logic selection control input control lines, as well as the data values present on the pair of complementary sense lines 505-1 and 505-2 when the isolation transistors 550-1 and 550-2 are enabled via the ISO control signal being asserted.

According to various embodiments, the logical operation selection logic 513 can include four logic selection transistors: logic selection transistor 562 coupled between the gates of the swap transistors 542 and a TF signal control line, logic selection transistor 552 coupled between the gates of the pass gates 507-3 and 507-4 and a TT signal control line, logic selection transistor 554 coupled between the gates of the pass gates 507-3 and 507-4 and a FT signal control line, and logic selection transistor 564 coupled between the gates of the swap transistors 542 and a FF signal control line. Gates of logic selection transistors 562 and 552 are coupled to the true sense line through isolation transistor 550-1 (having a gate coupled to an ISO signal control line). Gates of logic selection transistors 564 and 554 are coupled to the complementary sense line through isolation transistor 550-2 (also having a gate coupled to an ISO signal control line).

Data values present on the pair of complementary sense lines 505-1 and 505-2 can be loaded into the compute component 535 via the pass gates 507-3 and 507-4. When the pass gates 507-3 and 507-4 are OPEN (e.g., conducting), data values on the pair of complementary sense lines 505-1 and 505-2 are passed to the compute components 535 (e.g., loaded into the shift register). The data values on the pair of complementary sense lines 505-1 and 505-2 can be the data value stored in the sense amplifier 506 when the sense amplifier is fired. The logical operation selection logic signal, Pass, is high to OPEN the pass gates 507-3 and 507-4.

The ISO, TF, TT, FT, and FF control signals can operate to select a logical function to implement based on the data value ("B") in the sense amplifier 506 and the data value ("A") in the compute component 535. In particular, the ISO, TF, TT, FT, and FF control signals are configured to select the logical function to implement independent from the data value present on the pair of complementary sense lines 505-1 and 505-2 (although the result of the implemented logical operation can be dependent on the data value present on the pair of complementary sense lines 505-1 and 505-2. That is, the ISO, TF, TT, FT, and FF control signals select the logical operation to implement directly since the data value present on the pair of complementary sense lines 505-1 and 505-2 is not passed through logic to operate the gates of the pass gates 507-3 and 507-4.

Additionally, FIG. 5 shows swap transistors 542 configured to swap the orientation of the pair of complementary sense lines 505-1 and 505-2 between the sense amplifiers 506 and the compute component 535. When the swap transistors 542 are OPEN, data values on the pair of complementary sense lines 505-1 and 505-2 on the sense amplifiers 506 side of the swap transistors 542 are oppositely-coupled to the pair of complementary sense lines 505-1 and 505-2 on the compute component 535 side of the swap transistors 542, and thereby loaded into the loadable shift register of the compute component 535.

The logical operation selection logic signal Pass can be activated (e.g., high) to OPEN the pass gates 507-3 and 507-4 when the ISO control signal line is activated and either the TT control signal is activated (e.g., high) and data value on the true sense line is "1" or the FT control signal is activated (e.g., high) and the data value on the complement sense line is "1."

The data value on the true sense line being a "1" OPENs logic selection transistors 552 and 562. The data value on the complementary sense line being a "1" OPENs logic selection transistors 554 and 564. If the ISO control signal or either the respective TT/FT control signal or the data value on the corresponding sense line (e.g., sense line to which the gate of the particular logic selection transistor is coupled) is not high, then the pass gates 507-3 and 507-4 will not be OPENed by a particular logic selection transistor.

The logical operation selection logic signal Pass* can be activated (e.g., high) to OPEN the swap transistors 542 (e.g., conducting) when the ISO control signal line is activated and either the TF control signal is activated (e.g., high) and data value on the true sense line is "1," or the FF control signal is activated (e.g., high) and the data value on the complement sense line is "1." If either the respective control signal or the data value on the corresponding sense line (e.g., sense line to which the gate of the particular logic selection transistor is coupled) is not high, then the swap transistors 542 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together.

The sensing circuitry illustrated in FIG. 5 is configured to select one of a plurality of logical operations to implement directly from the four logic selection control signals (e.g., logical operation selection is not dependent on the data value present on the pair of complementary sense lines). Some combinations of the logic selection control signals can cause both the pass gates 507-3 and 507-4 and swap transistors 542 to be OPEN at the same time, which shorts the pair of complementary sense lines 505-1 and 505-2 together. According to a number of embodiments of the present disclosure, the logical operations which can be implemented by the sensing circuitry illustrated in FIG. 5 can be the logical operations summarized in the logic tables shown in FIG. 6.

Figure 6:
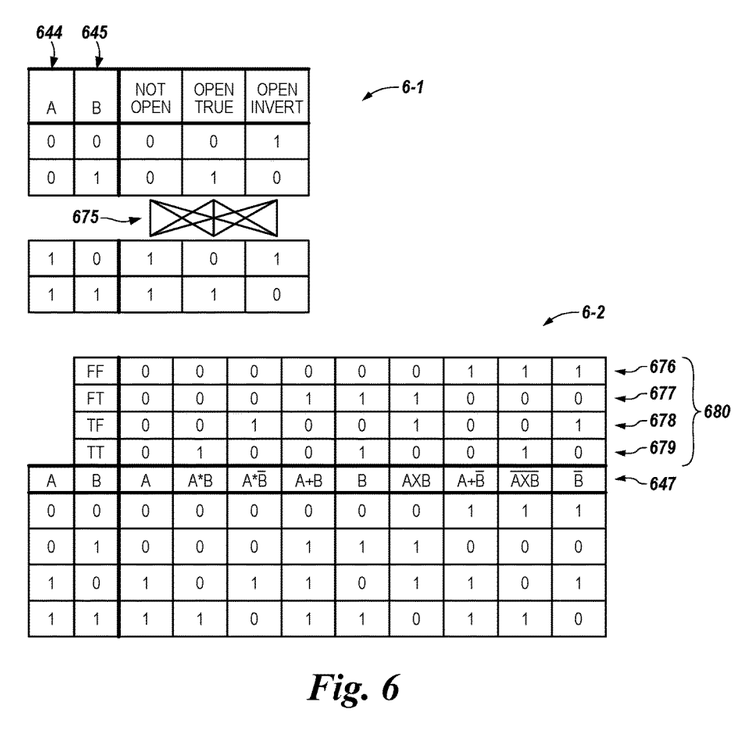
FIG. 6 is a logic table illustrating selectable logic operation results that can be implemented by sensing circuitry such as that shown in FIG. 5 in accordance with a number of embodiments of the present disclosure.

FIG. 6 is a logic table illustrating selectable logic operation results that can be implemented by sensing circuitry such as that shown in FIG. 5 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 506 and compute component 535. The four control signals, in conjunction with a particular data value present on the complementary sense lines, controls the states of the pass gates 507-3 and 507-4 and swap transistors 542, which in turn affects the data value in the compute component 535 and/or sense amplifiers 506 before/after firing. The capability to selectably control states of the swap transistors 542 facilitates implementing logical operations involving inverse data values (e.g., inverse operands and/or inverse result), among others.

Logic Table 6-1 illustrated in FIG. 6 shows the starting data value ("A") stored in the compute component 535 shown in column 644, and the starting data value ("B") stored in the sense amplifiers 506 shown in column 645. The starting data value ("B") can be stored in one of the sense amplifiers 506 (e.g., a first sense amplifier 206-1 or a second sense amplifier 206-2 as illustrated in FIG. 2). The other 3 column headings in Logic Table 6-1 refer to the states of the pass gates 507-3 and 507-4, and the swap transistors 542, which can respectively be controlled to be OPEN (e.g., conducting) or CLOSED (e.g., not conducting) depending on the state of the four logic selection control signals (e.g., TF, TT, FT, and FF), in conjunction with a particular data value present on the pair of complementary sense lines 505-1 and 505-2. The "NOT OPEN" column corresponds to the pass gates 507-3 and 507-4 and the swap transistors 542 both being in a non-conducting condition, the "OPEN TRUE" corresponds to the pass gates 507-3 and 507-4 being in a conducting condition, and the "OPEN INVERT" corresponds to the swap transistors 542 being in a conducting condition. The configuration corresponding to the pass gates 507-3 and 507-4 and the swap transistors 542 both being in a conducting condition is not reflected in Logic Table 6-1 since this results in the sense lines being shorted together.

Via selective control of the pass gates 507-3 and 507-4 and the swap transistors 542, each of the three columns of the upper portion of Logic Table 6-1 can be combined with each of the three columns of the lower portion of Logic Table 6-1 to provide 3×3=9 different result combinations, corresponding to nine different logical operations, as indicated by the various connecting paths shown at 675. The nine different selectable logical operations that can be implemented by the sensing circuitry, e.g., 150 in FIG. 1A, are summarized in Logic Table 6-2 illustrated in FIG. 6, including an XOR logical operation.

The columns of Logic Table 6-2 illustrated in FIG. 6 show a heading 680 that includes the state of the logic selection control signals (FF, FT, TF and TT). For example, the state of a first logic selection control signal is provided in row 676, the state of a second logic selection control signal is provided in row 677, the state of a third logic selection control signal is provided in row 678, and the state of a fourth logic selection control signal is provided in row 679. The particular logical operation corresponding to the results is summarized in row 647.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
   a host; and
   a memory device coupled to the host and configured to:
   receive, while a first operation is being performed, a request to perform a second operation from the host; and
   perform, while data associated with the first operation is stored in sensing circuitry of the memory device, the second operation using the sensing circuitry.

2. The system of claim 1, wherein the memory device is configured to provide a result of the second operation to the host.

3. The system of claim 2, wherein the data associated with the first operation is stored in an array of memory cells of the memory device subsequent to the result of the second operation being provided to the host.

4. The system of claim 1, wherein the second operation associated with the request received from the host has a priority over the first operation.

5. The system of claim 4, wherein the memory device performs the first operation independently from the host.

6. The system of claim 1, wherein the sensing circuitry includes a first sense amplifier and a second amplifier, and wherein the memory device is configured to:
   store, in response to receipt of the request to perform the first operation, the data associated with the first operation in the first sense amplifier; and
   perform, while the data associated with the first operation is being stored in the first sense amplifier, the second operation using the second sense amplifier.

7. The system of claim 6, wherein:
   the first sense amplifier is coupled to a compute component of the sensing circuitry; and
   the controller is configured to continue a performance of the first operation via the compute component, while the controller performs the second operation using the sense amplifier.

8. A system, comprising:
   a host; and
   a memory device coupled to the host and configured to:
   receive, while a first operation is being performed, a request to perform a second operation from the host; and
   initiate, prior to a completion of the first operation, the second operation using the sensing circuitry such that the controller performs the first operation while data associated with the first operation is stored in sensing circuitry.

9. The system of claim 8, wherein the data associated with the first operation is stored in the sensing circuitry until a completion of the second operation.

10. The system of claim 8, wherein the controller is configured to store, upon a completion of the second operation, the data associated first operation back to an array of memory cells without firing a column decode signal.

11. The system of claim 8, wherein the system comprises a server.

12. The system of claim 8, wherein the controller comprises a state machine.

13. The system of claim 8, wherein the controller comprises a sequencer.

14. The system of claim 8, wherein the host and the memory device are located on a same integrated circuit.

15. The system of claim 14, wherein the first operation is a compute operation.

16. A method, comprising:
   receiving, while performing a first operation using sensing circuitry, a request to perform a second operation from a host;
   determining whether to pause the first operation based on an priority comparison between the first operation and the second operation; and
   pausing, responsive to determining that the second operation is given a higher priority over the first operation, the first operation to initiate the second operation while data associated with the first operation is being stored in the sensing circuitry.

17. The method of claim 16, further comprising completing, responsive to determining that the second operation is not given a higher priority over the first operation, the first operation prior to initiating the second operation.

18. The method of claim 16, wherein the second operation requested from the host is given a higher priority over the first operation being performed independently.

19. The method of claim 16, wherein storing the data associated with the first operation in the sensing circuitry comprises storing the data associated with the first operation in a sense amplifier of the sensing circuitry.

20. The method of claim 19, wherein initiating the second operation comprises using another sensing amplifier of the sensing circuitry to perform the second operation.